(12) United States Patent
Hesse et al.

(10) Patent No.: US 6,308,881 B1
(45) Date of Patent: Oct. 30, 2001

(54) QUALITY CONTROL METHOD

(75) Inventors: Hans Jürgen Hesse; Dietmar Holtgrewe, both of Paderborn (DE)

(73) Assignee: Hesse & Knipps GmbH (DE)

( * ) Notice: Subject to any disclaimer, the term of this patent is extended or adjusted under 35 U.S.C. 154(b) by 0 days.

(21) Appl. No.: 09/548,761

(22) Filed: Apr. 13, 2000

Related U.S. Application Data

(63) Continuation of application No. PCT/DE98/02999, filed on Oct. 7, 1998.

(30) Foreign Application Priority Data

Oct. 13, 1997 (DE) ............................................... 197 45 131

(51) Int. Cl.⁷ .......................... B23K 31/02; B23K 31/12; G01M 7/00
(52) U.S. Cl. .......................... 228/102; 228/4.5; 228/103; 228/104; 228/180.5; 73/588
(58) Field of Search .................... 228/102, 103, 228/104, 4.5, 180.5, 1.1, 110.1, 8, 9; 73/1.75, 1.82, 582, 588

(56) References Cited

U.S. PATENT DOCUMENTS

| | | | |
|---|---|---|---|
| 4,341,574 | * | 7/1982 | Landes . |
| 4,815,001 | * | 3/1989 | Uthe et al. . |
| 4,984,730 | * | 1/1991 | Gobel et al. . |
| 5,357,423 | * | 10/1994 | Weaver et al. . |
| 5,894,981 | * | 4/1999 | Kelly . |
| 5,934,996 | * | 8/1999 | Nagai et al. . |
| 6,105,848 | * | 8/2000 | Horibe et al. . |
| 6,112,969 | * | 9/2000 | Horibe et al. . |
| 6,214,718 | * | 4/2001 | Nagai et al. . |

FOREIGN PATENT DOCUMENTS

| | | |
|---|---|---|
| 217454 | 4/1983 | (DE) . |
| 3333601 | 3/1984 | (DE) . |
| 208310 | 1/1987 | (EP) . |
| 368533 | 5/1990 | (EP) . |
| 540189 | 5/1993 | (EP) . |

* cited by examiner

Primary Examiner—Tom Dunn
Assistant Examiner—Kiley Stoner
(74) Attorney, Agent, or Firm—Baker Botts LLP

(57) ABSTRACT

A quality control method for ultrasonic wire bonding is provided wherein the deformation of the wire to be bonded to a contact surface is substantially constantly monitored. The method includes generating an ultrasonic output table. In the table, the current status of the bonding process is represented as a function of the gradient of deformation of the wire, the impedance of the transducer-bond wedge unit, as well as the currently reached deformation of the wire. The desired gradient of deformation of the wire, a function of the particular status of the process, is specified as the desired value. A correcting variable for the ultrasonic generator is calculated by the addition of correction values formed in the controller to the respective current table values.

7 Claims, 3 Drawing Sheets

QUALITY CONTROL METHOD

This application is a continuation of PCT/DE98/02999 filed Oct. 7, 1998.

FIELD OF THE INVENTION

The invention generally relates to a quality control method for ultrasonic wire bonding, and more particularly relates to a quality control method for ultrasonic wire bonding wherein the deformation of the wire to be bonded to a contact surface is substantially constantly monitored.

BACKGROUND OF THE INVENTION

Assembly of a large number of semiconductor structural elements requires the production of wire bridges between the contact islands (bond pads) on the semiconductor chips and points of contact on external connections. If wire bridges are to be made using aluminum wire, the generally known ultrasonic wire bonding process is preferred for bonding.

Since modern semiconductor structural elements often require a large number of bonds, ultrasonic wire bonding preferably is performed by automatic ultrasonic wire bonders. Because of the large volume involved, special importance is of course attached to productivity. This means that wire bridges must be produced within as short as possible a time while maintaining the quality of the resulting bondings. Bonding connections between the bonding wire and the particular point of contact must have sufficient adhesive force, i.e., the elements to be welded together must have entered into a metallic bond with sufficiently great contact surface.

In order to ensure proper bond strength, a variety of parameters need to be considered. Such parameters include bonding force, ultrasonic energy or alternatively the level of ultrasonic vibrations and the duration of action of ultrasonic vibrations. These parameters may be specified by means of a suitable control device. Additional parameters that directly influence the welding process are material parameters which relate to the elements to be welded together (bonding wire, point of contact).

It has been found in previously known quality control methods that individual parameters were recognized as essential and were then selectively monitored during the ultrasonic welding process.

One of these parameters is the deformation of the bonding wire during the ultrasonic welding process. For example, EP 0 208 310 A1 discloses a method having a device suitable for controlling the course of the process and for quality control in ultrasonic welding of work pieces. In this case, the deformation of the work pieces to be welded together is utilized for controlling process variables. To this end, a displacement transducer in the form of a laser measuring device is provided for measuring the position of the ultrasonic sonotrode (bond wedge). Here the ultrasonic generator is cut off when a specific wire deformation is reached.

A similar accomplishment has been disclosed in EP 0 540 189 B1. In this case, quality control is effected by monitoring the deformation of the wire, and controlling the duration and level of ultrasonic action accordingly. The level is controlled such that the level is inversely proportional to bond wire deformation, i.e., ultrasound level is reduced with increasing deformation.

A wire connection or wiring device having an ultrasonic modulator has also been disclosed in DE 33 33 601 A1, wherein the deformation of the wire is monitored by means of a slot sensing device. Here the amplitude and the duration of ultrasonic action is controlled as a function of the deformation of the wire. In addition, a contact control, by which the variation in impedance in the contact time is controlled, is also provided.

Another method for controlling ultrasonic welding processes has been disclosed in DD 217 454 A1, wherein for quality control purposes, a continuous impedance measurement takes place even during subsequent ultrasonic action on the wire so that the contact time can be determined. Since the impedance continues to vary during ultrasonic bonding, the measured values can constantly be compared with desired values. As soon as the desired value representative of the cutoff time is reached, the ultrasonic generator is cut off.

However, it has been found that quality control by the above methods or devices is insufficient and has many shortcomings. Monitoring the deformation of the wire is not sufficient, since this parameter does not guarantee that a welded connection with the desired properties has actually been produced upon cutoff of the ultrasonic vibrations when a specific deformation is reached. For example, if the bonding process is started with too much energy, rapid deformation indeed takes place, but a metallic bond between the elements to be welded together may fail to form even though the value of maximum deformation has been reached. Similar problems also arise when the amplitude/output of the ultrasonic vibrations is varied during the welding process. Accordingly, spontaneous strong deformation of the wire should be prevented.

SUMMARY OF THE INVENTION

An object of the invention is to procure a quality control method that does not have the shortcomings of the prior art described and by which a consistent bond quality is actually obtained even when the parameters of the elements to be welded together in the individual welding processes are very different, e.g., oxide layers of different thicknesses, impurities or the like.

A quality control method for ultrasonic wire bonding is provided wherein the deformation of the wire to be bonded to a contact surface is substantially constantly monitored. The method includes generating an ultrasonic output table. In the table, representing the current status of the bonding process as a function of the gradient of deformation of the wire, the impedance of the transducer-bond wedge unit, as well as the currently reached deformation of the wire. The desired gradient of deformation of the wire, as a function of the particular status of the process, is specified as the desired value. A correcting variable for the ultrasonic generator is calculated by the addition of correction values formed in the controller to the respective current table values.

A further quality control method for ultrasonic wire bonding, wherein the deformation of the wire to be bonded to a contact surface is substantially constantly monitored, includes a learning phase where an ultrasonic output table representing the particular current status of the process is created. The table is created as a function of the gradient of deformation of the wire, the impedance of the transducer-bond wedge unit as well as the currently reached deformation of the wire. The table is generated by a control parameterized neural network, where the ultrasonic output required for the particular status of the process is calculated by way of a fuzzy controller and the ultrasonic levels are determined by the neural network. The values of the ultrasonic levels are fed to the ultrasonic generator on a closely specified clock cycle.

BRIEF DESCRIPTION OF THE DRAWING

Further objects, features and advantages of the invention will become apparent from the following detailed description taken in conjunction with the accompanying figures showing illustrative embodiments of the invention, in which.

Figure 1:
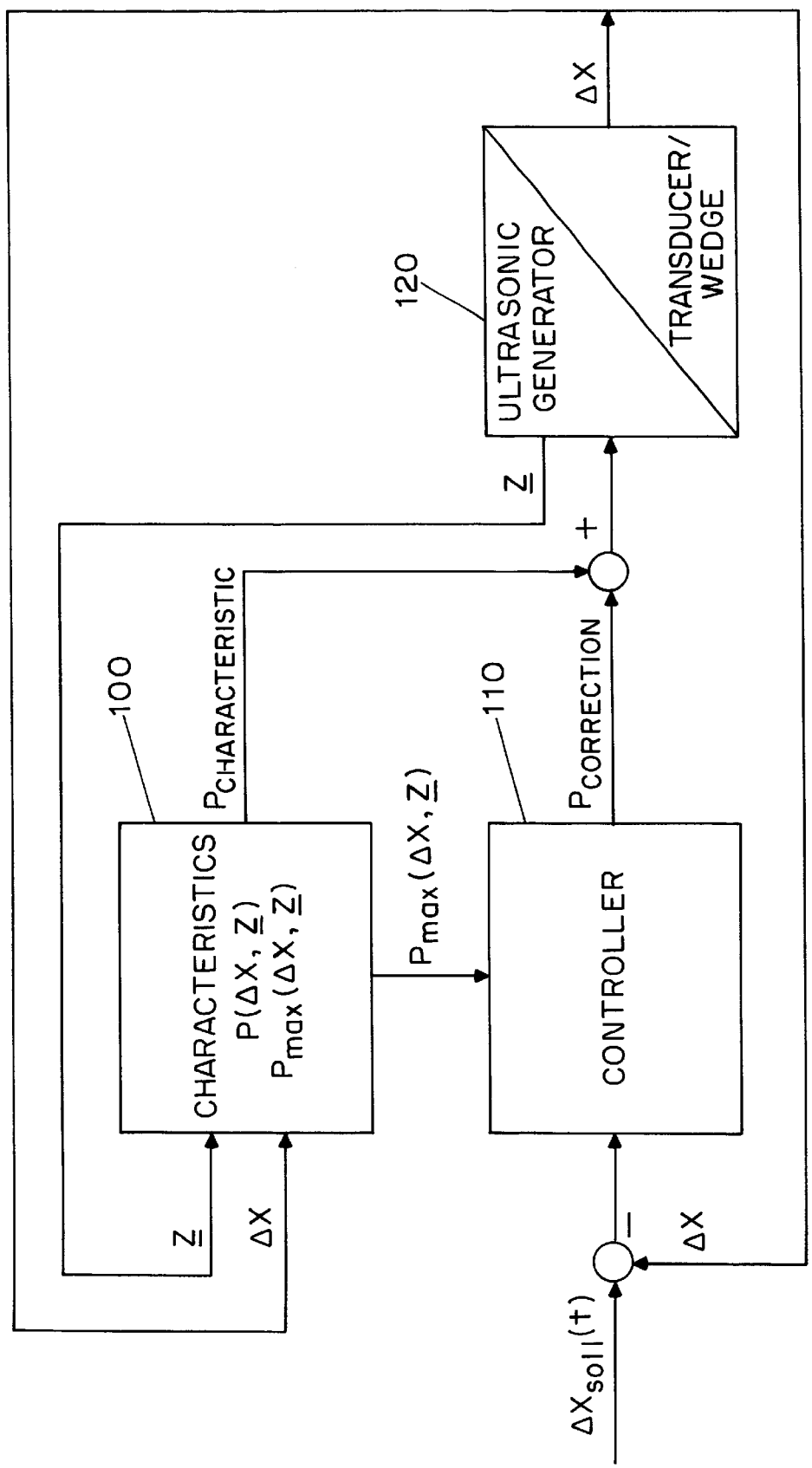
FIG. 1 is a schematic block diagram for the quality control method, wherein control of the transducer-bond wedge unit according to the invention takes place by means of a family of characteristics and a controller for the formation of correction values.

Throughout the figures, the same reference numerals and characters, unless otherwise stated, are used to denote like features, elements, components or portions of the illustrated embodiments. Moreover, while the subject invention will now be described in detail with reference to the figures, it is done so in connection with the illustrative embodiments. It is intended that changes and modifications can be made to the described embodiments without departing from the true scope and spirit of the subject invention as defined by the appended claims.

DETAILED DESCRIPTION OF PREFERRED EMBODIMENTS

It has been found that bond quality depends upon the rate of deformation, i.e., the deformation gradient, and not upon the magnitude of deformation alone. The sole consideration of current deformation for the adjustment of ultrasonic output therefore does not suffice to ensure consistent bonding results.

In order to prevent spontaneous deformation of the wire during bonding, according to the method of the invention, deformation of the wire per unit of time (deformation gradient with typical values $\Delta$ of some 0.5 $\mu$m/ms) is used for determining and controlling the ultrasonic output currently required. An additional criterion used for the determination of currently necessary ultrasonic output, or resulting bonding force, is the degree of bonding of the wire to the bond island or contact surface. The degree of bonding can be determined by the impedance (magnitude and phase) of the transducer-bond wedge unit measured in the ultrasonic generator. The ultrasonic output can then be produced as a function of the deformation gradient, the current impedance of the transducer-bond wedge unit and the current state of deformation reached.

FIG. 1 shows a schematic representation for quality control of a wire bonding process wherein, for determination of the ultrasonic output level required for the current status of the process, use is made of a table in which the ultrasonic outputs (P) belonging to the particular status of the process are contained as a function of the deformation of the wire as well as the gradient of deformation of the wire ($\Delta$x). This table is applied by experienced technologists and can always be adapted to new knowledge.

The table 100 value $P_{Characteristic}$, representing the current status of the process, is made available, together with the correction value 100 $P_{Correction}$, for controlling the ultrasonic generator 120.

Figure 2:
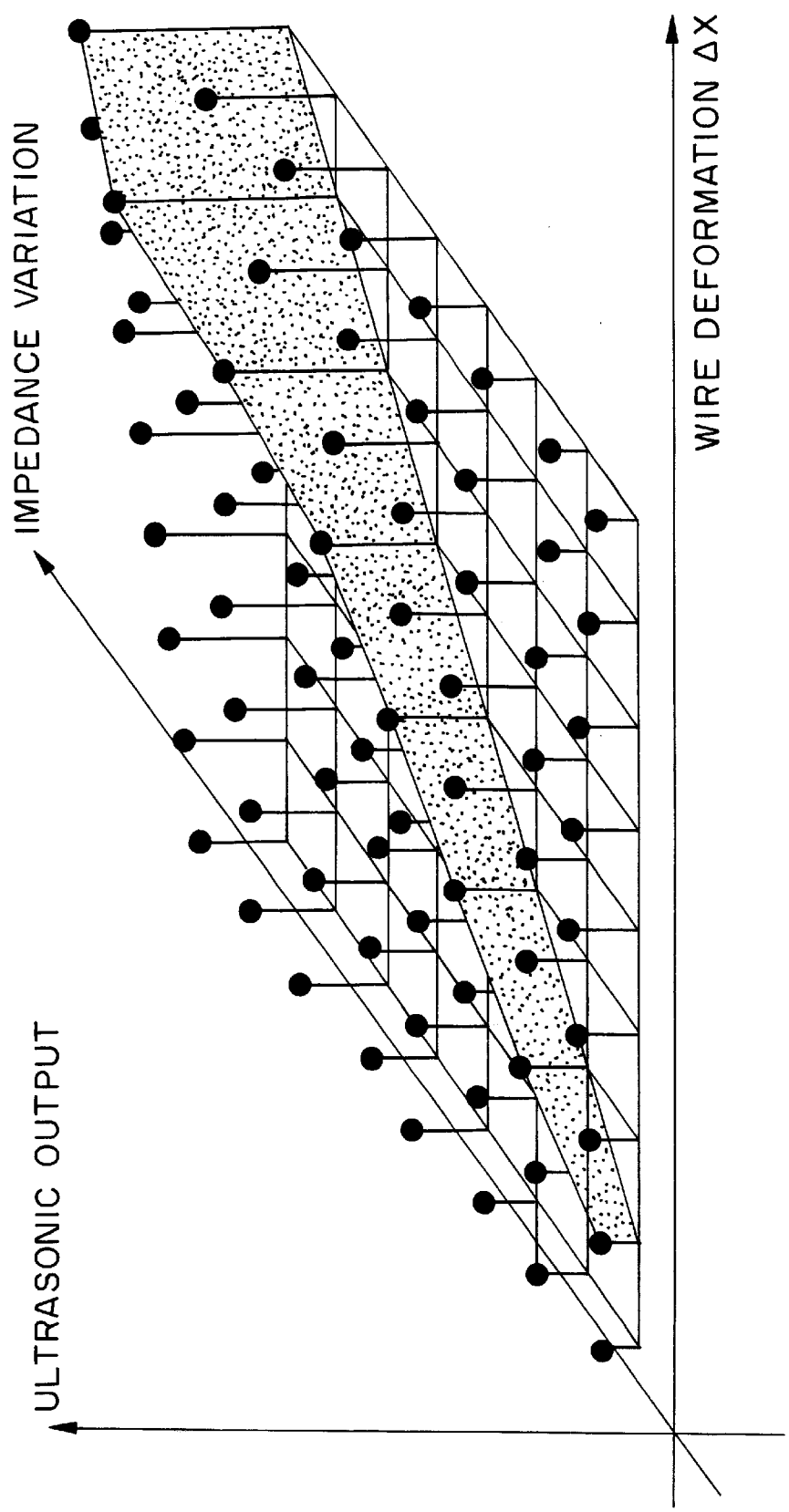
FIG. 2 is a graph illustrating a family of characteristics of ultrasonic output as a function of the gradient of deformation of the wire and the variation in impedance of the transducer-bond wedge unit.

When the image of the process by the table is good enough, the controller will add only very small correction values $P_{Correction}$ to the table values $P_{Characteristic}$. When there are significant deviations from the specified deformation profile, however, the correcting variable $P_{Correction}$ may not exceed a maximum value. This aides in preventing irreversible spontaneous deformation of the wire. The values for limitation of the correcting variables $P_{max}(\Delta x, z)$ are likewise based on the experience of technologists. A weighting factor for table values, by which adaptation of the table values to current material-dependent process parameters is obtained, can be derived from the course of the correction value for the correcting variable. FIG. 2 graphically illustrates such a table for controlling the bonding process.

Figure 3:
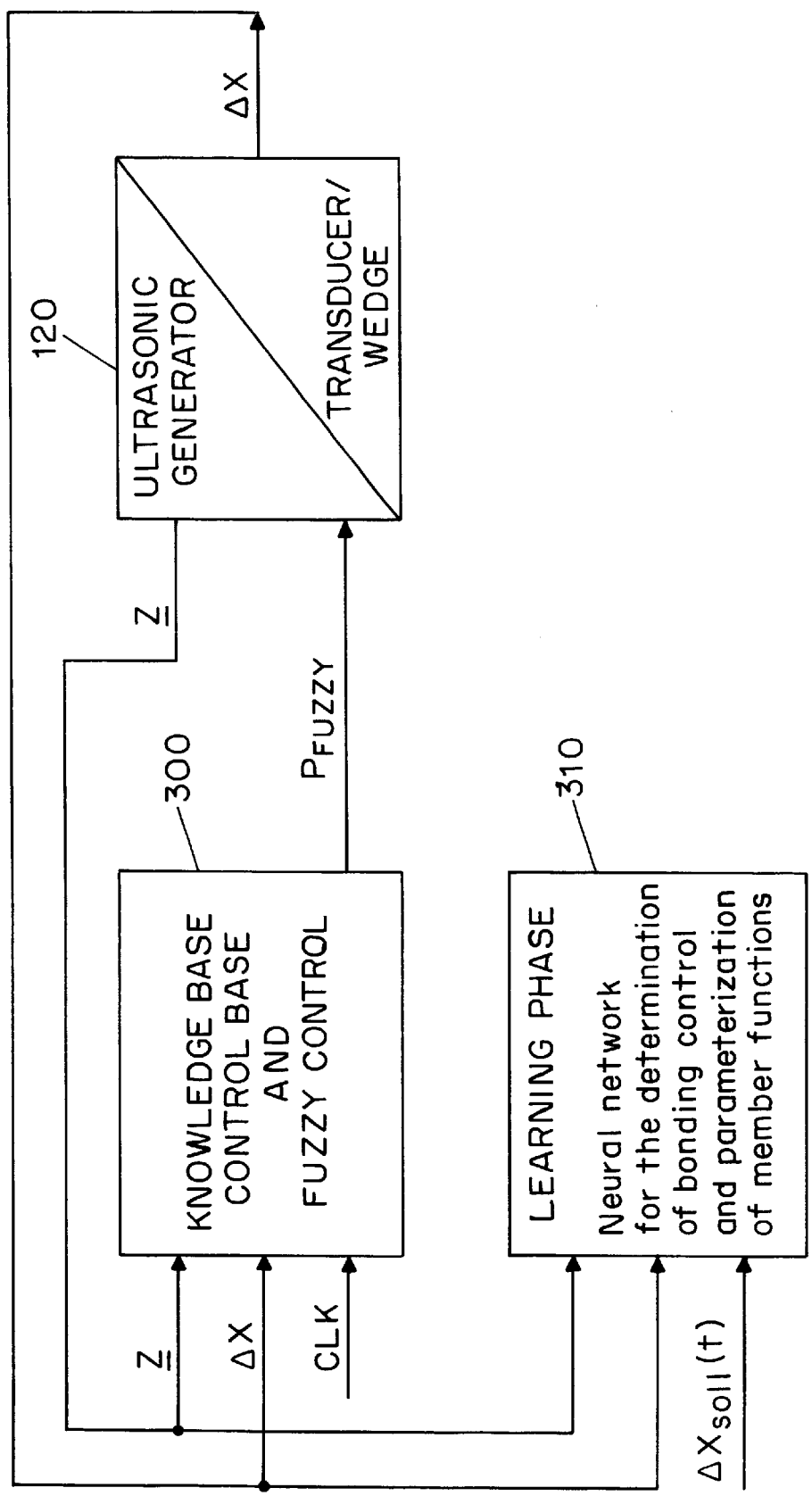
FIG. 3 is a schematic block diagram for a quality control method wherein the necessary bonding parameters are automatically created.

For ultrasonic wire bonding devices on which extremely unlike materials are bonded, the width of the process window that can be reached by the abovementioned method may be too small. This problem is solved by the method represented schematically in FIGS. 2 and 3. In this case, operator intervention is not required for determination of the optimal bonding parameters. Instead, the quality assigned to the individual bond is communicated to the bonder from outside during a learning phase.

Automatic bonding is preceded by a learning phase. A neural network 310 parameterizes the member functions of a control mechanism, on the basis of which the bondings adapted to the current material data are performed. In a first variant of this method, by means of "fuzzy" formulated control parameterized in the learning phase. With the aid of a fuzzy control 310, the ultrasonic output $P_{Fuzzy}$ is calculated as a function of the impedance Z and the deformation of the wire $\Delta$x in order to obtain the specified course of deformation. This method is tolerant of fluctuations in material data and other environmental conditions influencing the process.

It is known that, with stable material data and a suitable process window, the bonding process supplies consistently good bonding results at a temporarily closely specified sequence of ultrasonic levels. For this reason, in a second variant of the above-mentioned method, calculation of the correcting variables may be omitted. Here the ultrasonic levels $P_{Fuzzy}$ determined by the neural network are fed to the transducer-bond wedge unit on a closely specified cycle CLK.

Although the present invention has been described in connection with specific exemplary embodiments, it should be understood that various changes, substitutions and alterations can be made to the disclosed embodiments without departing from the spirit and scope of the invention as set forth in the appended claims.

What is claimed is:

1. A quality control method for ultrasonic wire bonding, wherein a deformation of a wire to be bonded to a contact surface is substantially constantly monitored, comprising:

generating an ultrasonic output table, representing a current status of the process in each case as a function of a gradient of deformation of the wire, an impedance of a transducer-bond wedge unit, as well as a currently reached deformation of the wire, wherein a desired gradient of deformation of the wire, as a function of a particular status of the process, is specified as a desired value, and wherein a correcting variable for the ultrasonic generator is calculated by an addition of correction values formed in the controller to the respective current table values.

2. The method according to claim 1, wherein a maximum value is specified for the correction value.

3. The method according to claim 1, wherein the ultrasonic output table is created as a function of the variation in impedance of the transducer-bond wedge unit.

4. The method according to of claim 1, wherein a weighting factor for the table values for their adaptation to the current material-dependent process parameters is derived from a course of the correction value for the correcting variable for the ultrasonic output.

5. The method according to claim 1, wherein the ultrasonic output table is automatically created in a learning phase, where in addition only a quality parameters assigned to the individual bonds can be specified manually.

6. The method according to claim 5, wherein with a control parameterized in the learning phase by a neural network, the ultrasonic output is calculated by means of a fuzzy controller as a function of the impedance and the gradient of deformation of the wire.

7. A quality control method for ultrasonic wire bonding, wherein a deformation of a wire to be bonded to a contact surface is substantially constantly monitored, wherein during a learning phase an ultrasonic output table representing a particular current status of the process is created as a function of a gradient of deformation of the wire, an impedance of a transducer-bond wedge unit as well as a currently reached deformation of the wire, by means of the control parameterized by a neural network, where the ultrasonic output required for the particular status of the process is calculated by means of a fuzzy controller and in that ultrasonic levels determined by the neural network are fed to the ultrasonic generator on a closely specified cycle.

* * * * *